United States Patent [19]

Thompson

[11] Patent Number: 4,604,542

[45] Date of Patent: Aug. 5, 1986

[54] BROADBAND RADIAL VIBRATOR TRANSDUCER WITH MULTIPLE RESONANT FREQUENCIES

[75] Inventor: Stephen C. Thompson, Euclid, Ohio

[73] Assignee: Gould Inc., Rolling Meadows, Ill.

[21] Appl. No.: 634,073

[22] Filed: Jul. 25, 1984

[51] Int. Cl.[4] .............................................. H01L 41/08

[52] U.S. Cl. .................................... 310/334; 310/323; 310/337; 310/369

[58] Field of Search ............................... 310/334-337, 310/369, 26, 322, 323; 367/155, 156, 157, 162, 165

[56] References Cited

U.S. PATENT DOCUMENTS

| | | | |
|---|---|---|---|
| 3,142,035 | 7/1964 | Harris | 310/337 X |
| 3,230,505 | 1/1966 | Parker et al. | 310/337 X |
| 3,277,433 | 10/1966 | Toulis | 310/337 X |
| 3,845,333 | 10/1974 | Holloway | 310/337 |
| 3,952,216 | 4/1976 | Madison et al. | 310/9.1 |
| 4,151,437 | 4/1979 | Tocquet | 310/337 |
| 4,373,143 | 6/1983 | Lindberg . | |
| 4,432,080 | 2/1984 | Wardle . | |
| 4,433,399 | 2/1984 | Massa | 310/337 X |
| 4,435,794 | 3/1984 | Marshall, Jr. et al. . | |
| 4,525,645 | 6/1985 | Shirley et al. | 310/337 |

OTHER PUBLICATIONS

"Increasing the Bandwidth of a Cylindrical Piezoceramic Transducer by Means of Two Transition Layers", *Sov. Phys. Acous.*, vol. 22, No. 2, Mar.-Apr. 1976, B. N. Alekseev, pp. 101-104.

"Session KK. Engineering Acoustics V: Transducers", *J. Acous. Soc. AM. Suppl.*, 1, vol. 68, Fall 1980, pp. S67-S69.

"Piezoelectric and Piezomagnetic Materials and Their Function in Transducers", *Physical Acoustics*, vol. 1A, 1964, Don A. Berlincourt et al., pp. 169-171, 242-249.

*Primary Examiner*—Mark O. Budd

[57] ABSTRACT

A broadband radial vibrator transducer having at least two laminar resonant sections coupled to a radial electromechanical transducer element where each laminar section includes at least two layers. Each resonant section has a mass layer and a compliant member layer where the compliant member layer is fixed between the transducer element and the mass layer. The compliant member allows the resonant section to mechanically resonate along with the transducer element providing at least two resonant frequencies, thereby expanding the bandwidth of the transducer.

15 Claims, 8 Drawing Figures

BROADBAND RADIAL VIBRATOR TRANSDUCER WITH MULTIPLE RESONANT FREQUENCIES

CROSS REFERENCES TO RELATED APPLICATIONS

This application is related to a U.S. application Ser. No. 626,784, filed on July 2, 1984 entitled Broadband Longitudinal Vibrator Transducer by the same inventor and assigned to the assignee of the present invention.

BACKGROUND OF THE INVENTION

1. Field of the Invention

This invention relates to an electromechanical transducer and, more particularly, to a transducer commonly known as a radial vibrator transducer in which the dominant mechanical motion is in the radial direction of a cylindrical or spherical shaped transducer and which results in an alternate expansion and contraction of the transducer.

2. Description of the Prior Art

A device commonly known as a "radial vibrator" is a simple and widely used electromechanical or electroacoustical transducer type. Such a device in its simplest form consists of a cylindrical or spherical piece of active material which can be driven electrically to induce a radial expansion therein. For example, a tube or ring of a piezoelectric ceramic (such as a lead zirconate titanate formulation) which has electrodes on its inner and outer surfaces and is polarized in the radial direction may act as a radial vibrator. This type of device is usually operated at its first circumferential or "breathing mode" resonance frequency to achieve a higher output.

For a simple cylinder or sphere, the frequency of this resonance is predominantly determined by the type of material and the diameter of the ring or tube. In order to achieve a greater degree of control over the resonance frequency, a number of design schemes are commonly applied which fabricate the ring as a composite structure of alternating segments of active and inactive material. These methods are often implemented by joining bars of the different materials together as barrel staves to form a composite ring. The inactive material generally functions as an added mass and/or an added compliance which acts to lower the radial resonance frequency. An example of a prior art segmented ring radial vibrator is shown in FIG. 1. Piezoelectric material or active staves 1 are bonded to inactive staves 2 forming a composite cylinder and the active staves are electrically wired in parallel so that when a voltage is applied between the electrical leads, the composite cylinder expands or contracts along the radial axis of the device. The arrows on FIG. 1 indicate the direction of polarization and, as illustrated, the electrodes in this structure are located at the boundaries between the active 1 and inactive 2 materials. The device of FIG. 1 may be used as either a generator or receiver of mechanical or acoustic energy and is normally operated in a frequency band approximately centered on its primary mechanical resonance frequency.

It is well known by those of ordinary skill in the art that the performance of the conventional transducer in FIG. 1 can be approximated by the analogous behavior of a simplified electrical equivalent circuit, as shown in FIG. 2. This approximation applies equally as well to a solid ring or a segmented ring as in FIG. 1. In the circuit, M represents the total mass of the ring, and the circumferential compliance of the ring is represented by the capacitor C. $C_0$ represents the clamped capacitance of the ring and $\phi$ represents the electromechanical transformation ratio of the active material. The resistor R at the right of the equivalent circuit represents the electric equivalent of the radiation resistance of the medium and the equivalent current u in the resistance R represents the velocity of the moving face of the radiator.

The transmitting voltage response (TVR) of this prior art device is calculated from this equivalent circuit approximation and is proportional to the current u divided by the drive voltage E at the input to the transducer circuit. In determining the response of the device, as expressed by Equation (1) below, the radiator impedance can be neglected.

$$TVR \propto \frac{u}{E} = \frac{j\omega C\phi}{1 - \omega^2 MC} \quad (1)$$

The transmitting voltage response has a single peak near the frequency where the denominator of the expression becomes zero. This occurs at the resonance (angular) frequency $\omega_r$ as set forth in Equation 2 below:

$$\omega_r = \frac{2}{\sqrt{MC}} \quad (2)$$

The method of analysis discussed above is well known in the transducer industry, as discussed in, for example, Leon Camp, *Underwater Acoustics,* Wiley & Sons, New York, 1970, pp. 136–142; and Butler, "Model for a ring transducer with inactive segments", J. Acoust. Soc. Am., Vol. 59, No. 2, Feb. 1976, pp. 480–482. More complete and accurate performance predictions for transducers can be obtained by using a computer model, such as developed by K. M. Farnham, obtainable from Transducer and Arrays Division, Naval Underwater Systems Center, New London Laboratory, in New London, Conn. A graph of a typical response curve, produced by the above-mentioned program, for the transducer of FIG. 1 is illustrated by curve 20 in FIG. 7.

A significant drawback of the prior art transducer of FIG. 1 is that the resonance frequency and operating bandwidth of the transducer cannot be independently controlled in a given size device. The low mechanical input impedance of this transducer at the radiating face also causes problems when the transducer is used in an array configuration where the input impedance of the radiating face needs to be high. As a practical limit, the mechanical input impedance of the array elements must be maintained higher than the acoustic mutual impedances of the array for all possible operating frequencies, thereby precluding operation in a narrow band near the peak of the transducer response where the mechanical impedance becomes small. The basic device, as shown in FIG. 1, also has significant practical limits on the achievable bandwidth. The operating bandwidth can be changed by decreasing or increasing the thickness of the ring of the active material 1, or by changing the compliance of the inactive staves 2. However, this design technique is limited by the following practical design considerations. As the active material becomes thinner, to increase the operating frequency bandwidth, the device becomes mechanically fragile, a significant drawback in transducers intended for underwater use which must withstand the effects of hydrostatic pressure. Furthermore, if inactive material staves are included to decrease the resonance frequency, the sensitivity and power handling capability of the device will be reduced, which is a significant drawback in applications requiring high acoustic output levels.

In an effort to broaden the operating bandwidth of radial vibrators, a number of additional techniques have been attempted. One technique uses electrical components, such as inductors or capacitors, connected between the electrical terminals of the transducer and the amplifier circuits to tune the response of the device. However, the modification using the special electrical termination can expand the bandwidth to a limited extent at the cost of increased size, weight and complexity. In addition, this method may produce localized high voltages at some circuit nodes requiring costly high voltage isolation and shielding. As with the untuned transducer, the tuned transducer when operated in an array configuration encounters significant practical problems.

Another well known technique for broadening the operating band of a transducer is to use external matching layers. The acoustic impedances of the transducer and the medium are matched through external matching layers as illustrated in FIG. 3. In FIG. 3 the internal active ring 1 is completely surrounded by a matching layer 3 consisting of a liquid which is preferably the same liquid as the medium. The liquid layer is surrounded by a solid ring 4 of a substance such as steel. This method will increase the bandwidth somewhat, as illustrated by curve 21 in FIG. 7, however, the requirement that the layers must conform to the surface and completely cover the device places a significant restriction on the range of operating frequency bands in which this technique can be used. In some applications, the use of a liquid matching layer is undesirable. In these cases, a compliant solid, such as plastic, could be used. However, the shape of the response curve is a fairly sensitive function of the density and speed of sound in the matching layer material making acceptable materials difficult to find. Further, when an external matching layer is used, at least two frequencies occur in the operating band where the head mechanical input impedance becomes unacceptably low for operation in an array configuration. This reduces the usable bandwidth by at least 20 percent.

SUMMARY OF THE INVENTION

It is an object of the present invention to provide a radial vibrator transducer which can operate over a wider range of frequencies than previously possible.

It is another object of this invention to provide a broad operating frequency bandwidth without special electrical termination components.

It is also an object of this invention to provide a transducer which can provide a single broad operating frequency band or two or more separate and distinct operating frequency bands.

It is a further object of this invention to provide a transducer with a mechanical input impedance which is high at the radiating face within the operating frequency band, so that the transducer can be used in an array configuration.

It is another object of the present invention to provide a transducer having a wide operating frequency bandwidth that does not require matching layers.

It is a further object of the present invention to provide a transducer with a high transmitting voltage response.

It is still an additional object of the present invention to provide a broadband frequency response without significant loss of efficiency.

It is a still further object of the present invention to provide a relatively flat response within the transducer operating band.

The present invention achieves the above objects by providing a number of mechanically resonant composite structures between the outside surface of the active ring or sphere and the radiating medium. The mechanical resonators may be of identical construction and materials or may be different in dimensions and materials. Each composite resonator comprises a compliant layer and a mass layer. The active material ring and the mass layer are separated from each other by the compliant member. The compliant member allows the transducer to vibrate at two resonance frequencies which can be approximated as the resonant frequency of the mass loaded ring if the compliant member were eliminated and the resonant frequency if the mechanical resonator were mounted on a rigid structure.

These, together with other objects and advantages, which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 4:
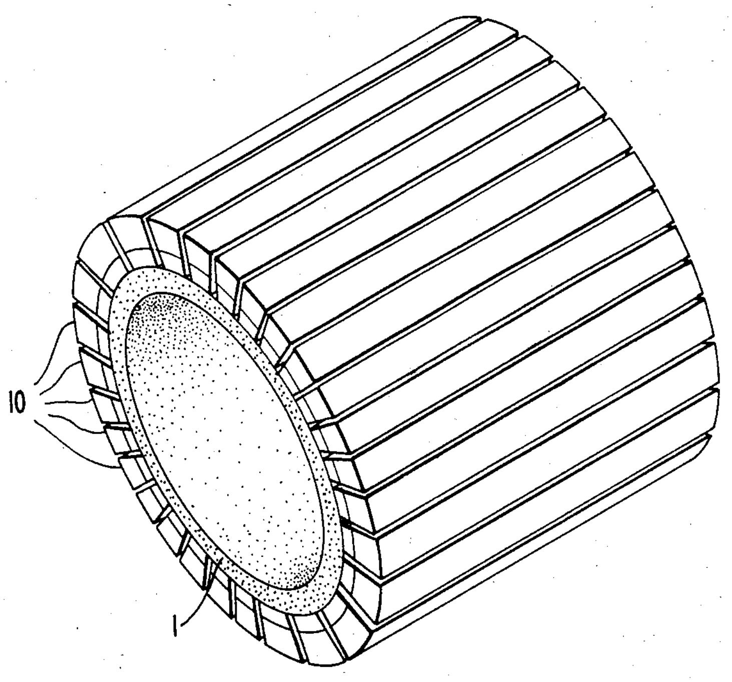
FIG. 4 illustrates a transducer according to the present invention.
Figure 5:
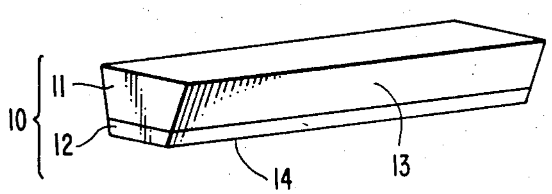
FIG. 5 illustrates the composite resonator 10 of the transducer of the present invention in more detail.

The present invention achieves broadband operating frequency characteristics by mounting mechanically resonant sections 10, each having a laminar structure, on the outside of the active ring 1 as illustrated in FIG. 4. The composite sections 10 are mounted in a barrel stave type arrangement where the separation between staves is minimal. FIG. 5 illustrates a single stave 10 of the present invention where the resonating mass 11 is made from a material strong enough to avoid bending resonance, such as aluminum, steel, a metal matrix composite or a graphite epoxy. A compliant member 12 is interposed between the mass 11 and the active material 1. The compliant member can be a plastic, such as VESPEL, which is a polyimide plastic sold by DuPont or TORLON, a polyamide-imide plastic sold by Amoco Chemical Corporation, or any other substance which provides the desired compliance. The active transducer element 1 can be a piezoelectric element manufactured from a piezoelectric ceramic material, such as a lead zirconate titanate formulation and can be obtained from Vernitron, Inc. in Bedford, Ohio. The side 13 of each stave should be slightly tapered to fit along side the other staves and the inner face 14 of the compliant member 12 should be slightly curved to fit the curved surface of the active ring 1. The electrodes (not shown) of the transducer are mounted on the inside and outside surface of the active material and polarized in the radial direction in a known manner. The entire transducer can be assembled either by using epoxy or loosely assembled and held together by a compression band. The adjustment of the compressive bias using the compression band is within the ordinary skill in the art.

Figure 6:
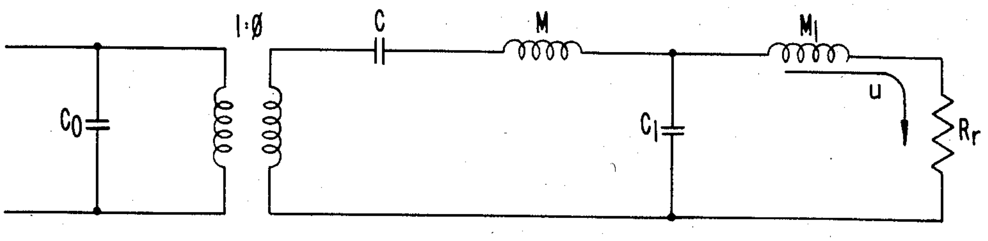
FIG. 6 is the equivalent electrical circuit for the transducer of FIG. 3.

An approximate equivalent electrical circuit for the transducer of FIG. 4 is illustrated in FIG. 6. In this equivalent circuit, $M_1$ is the mass of the resonant mass 11 in contact with the medium. M is the mass of the active ring 1. $C_0$ represents the clamped electrical capacitance of the active material 1, C represents the compliance of the active ring 1 and $C_1$ represents the compliance of the compliant member 12 separating the active ring 1 and the mass 11. $\phi$ represents the electromechanical transformation ratio of the active material. The transmitting voltage response for this transducer can be obtained from the following Equation 3:

$$TVR \propto \frac{u}{E} = \frac{j\omega C\phi}{1 - \omega^2(MC + M_1C + M_1C_1) + \omega^4 MM_1CC_1} \quad (3)$$

Equation 3 sets forth the response of a doubly resonant system and the expression in the denominator can be solved to produce the approximate resonant frequencies as was performed on Equation 1 to obtain Equation 2, previously discussed. Equation 3 allows the frequencies and intermodal coupling of the two resonant modes to be adjusted by selection of the masses of the mass 11 and the compliance of the compliant member 12. The two resonant frequencies for this embodiment can be more simply approximated as the frequency which the mass loaded ring would have if the compliance in the added resonant section were eliminated, and the frequency of the added resonant section if it was mounted on a rigid surface. However, a small amount of experimentation may be necessary to adjust the design to a final configuration because of such approximations.

Figure 1:
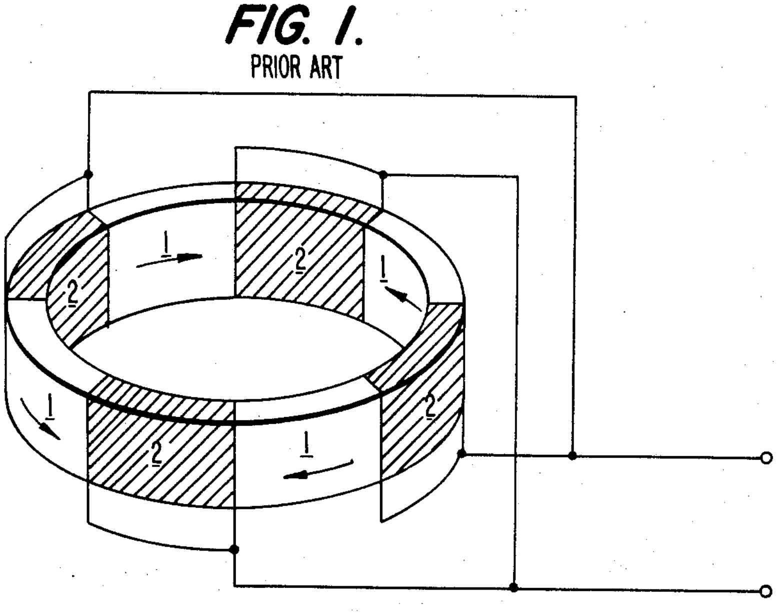
FIG. 1. PRIOR ART
FIG. 1 depicts the elements and construction of a prior art transducer.
Figure 2:
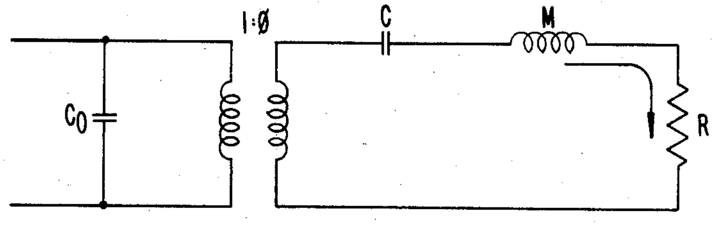
FIG. 2. PRIOR ART
FIG. 2 is the equivalent electric circuit for the transducer of FIG. 1.
Figure 3:
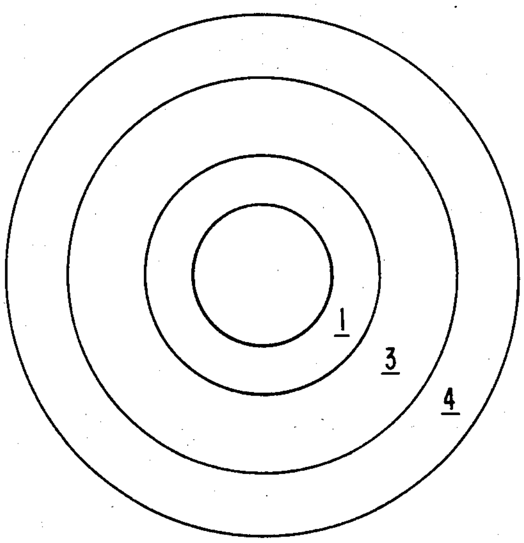
FIG. 3. PRIOR ART
FIG. 3 is a cross sectional view of a prior art transducer having matching layers 3 and 4.
Figure 7:
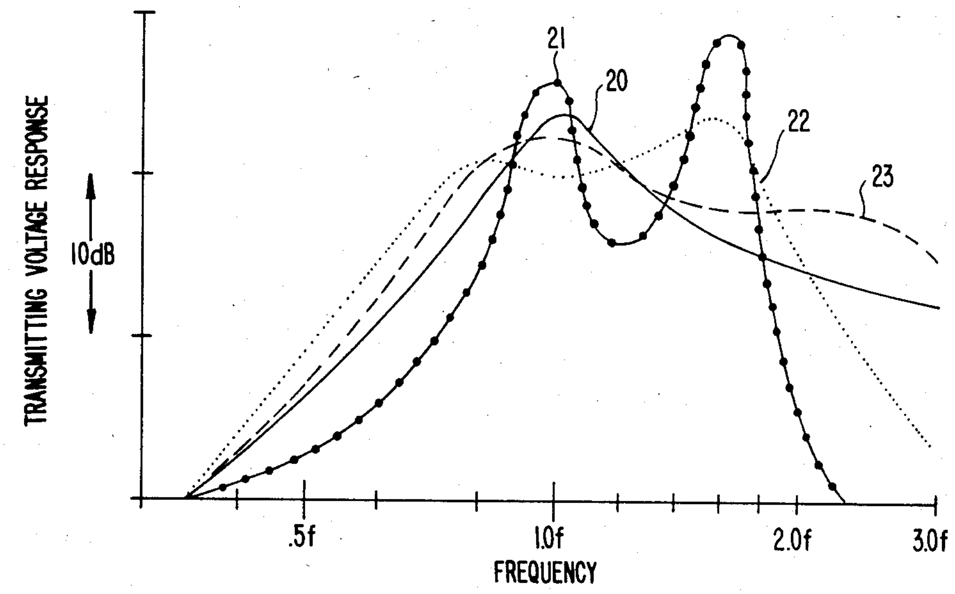
FIG. 7 provides a graphical comparison of the response of prior art transducers and the transducer of the present invention as illustrated in FIG. 4.

The computer program previously discussed was used to calculate the transmitting voltage response for this embodiment, as illustrated by curve 22 in FIG. 7. The curve 22 of FIG. 7 shows the response of the transducer of FIG. 3 without electrical terminating or tuning components. The calculated transmitting voltage response as defined by ANSI Transducer Standard S1.20-1972 is illustrated. As can be seen by the comparison of the prior art response curves (20 and 21) with the response curve 22 for the present invention, the present invention results in a much larger usable frequency bandwidth than the prior art. The present invention also provides a relatively high signal level and a flat response curve while providing the increased bandwidth. A further advantage of the present invention is its superior performance in an array configuration. The present invention provides a wide bandwidth over which the response is relatively high and simultaneously the mechanical input impedance is also high, a significant improvement over the prior art. The present invention also eliminates the need for matching layers by incorporating the function of such layers into the design of the transducer.

Figure 8:
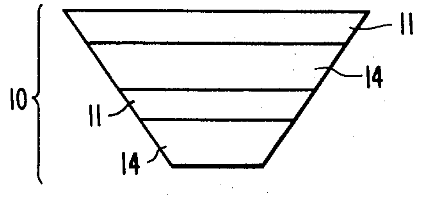
FIG. 8 illustrates another embodiment of the composite resonant section 10 of the present invention.

Using Equation 3 to adjust the masses and compliances of the elements of the transducer, it is also possible to provide a single transducer with two distinct operating bands. It is also possible to have different mass masses 11 adjacent to each other and also to have different compliance compliant members 12 adjacent to each other. These non-identical resonant sections will result in more than two resonant frequencies allowing a very flat response curve to be obtained. It is additionally possible to have a multitude of mass and compliant member layers as illustrated in FIG. 8. Such an embodiment having N mass layers will result in N+1 resonant frequencies and if the peaks of the response curve are positioned sufficiently close together, a very flat response curve can be obtained.

As would be recognized by those of ordinary skill in the art, the prior art methods of increasing the operating frequency bandwidth of a radial transducer can be applied to the present invention to provide further performance improvements.

The many features and advantages of the present invention are apparent from the detailed specification and, thus, it is intended by the appended claims to cover all such features and advantages of the device which will readily occur to those skilled in the art, it is not desired to limit the invention to the exact description and operation illustrated and described and, accordingly, all suitable modifications and equivalents may be resorted to falling within the scope of the invention.

I claim:

1. A transducer, comprising:

a radial electromechanical transducer element having a radiating surface on an outer circumference of said radial electromechanical transducer element; and at least two mechanically resonant sections coupled to the radiating surface of said radial electromechanical transducer element and each mechanically resonant section having a laminar structure.

2. A transducer as recited in claim 1, wherein said mechanically resonant sections each comprise:

a compliant member layer coupled to said radial electromechanical transducer element; and a mass layer coupled to said compliant member.

3. A transducer as recited in claim 2, wherein said compliant member layer is plastic.

4. A transducer as recited in claim 1, wherein said mechanically resonant sections do not have the same resonant frequency but have different resonant frequencies.

5. A transducer as recited in claim 1, wherein each mechanically resonant section has more than two layers where compliant layers alternate with mass layers.

6. A transducer as recited in claim 5, wherein said compliant layers are plastic.

7. A transducer as recited in claim 1, wherein said radial electromechanical transducer element has a curved radiating face.

8. A transducer, comprising:

transducer means for providing electromechanical conversion in an outward direction on an outer circumferential surface; and at least two resonant means, coupled to the outer circumferential surface of said transducer means, for allowing said transducer to resonate outward at at least first and second resonant frequencies.

9. A transducer as recited in claim 8, wherein said transducer means and said at least two resonant means each have a mass, the first resonant frequency is governed by the mass of said transducer means and the mass of said at least two resonant means considered together and the second resonant frequency is governed by the mass of said at least two resonant means considered alone.

10. A transducer as recited in claim 9, wherein said transducer means, one of said at least two resonant means and the other of said at least two resonant means each have a mass, said transducer resonates at at least a third resonant frequency where the second resonant frequency is governed by the mass of one of said two resonant means considered alone and the third resonant frequency is governed by the mass of the other of said two resonant means considered alone.

11. A transducer as recited in claim 8, wherein a mass of said transducer means and a mass of said at least two resonant means produce said first and second resonant frequencies forming a single operating frequency band.

12. A transducer as recited in claim 8, wherein a mass of said transducer means and a mass of said at least two resonant means produce said first and second resonant frequencies forming two separate operating bands.

13. A transducer as recited in claim 8, wherein each resonant means comprises:

at least one compliant means, coupled to said transducer means, for allowing resonance at the first and second resonant frequencies; and at least one resonant mass coupled to said compliant means.

14. A transducer as recited in claim 13, wherein said compliant means comprises plastic.

15. A transducer as recited in claim 8, wherein said transducer means is a radial transducer having a curved radiating surface.

* * * * *